United States Patent
Landolt

(10) Patent No.: US 11,342,948 B1
(45) Date of Patent: May 24, 2022

(54) MIXER MODULE FOR MIXING A RADIO FREQUENCY SIGNAL

(71) Applicant: Rohde & Schwarz GmbH & Co. KG, Munich (DE)

(72) Inventor: Oliver Landolt, Munich (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 21 days.

(21) Appl. No.: 17/110,772

(22) Filed: Dec. 3, 2020

(51) Int. Cl.
| | |
|---|---|
| *H04B 7/02* | (2018.01) |
| *H04L 1/02* | (2006.01) |
| *H04B 1/00* | (2006.01) |
| *H04B 1/30* | (2006.01) |

(52) U.S. Cl.
CPC .......... *H04B 1/0082* (2013.01); *H04B 1/302* (2013.01); *H04B 2001/307* (2013.01)

(58) Field of Classification Search
CPC . H04B 1/0082; H04B 1/302; H04B 2001/307
USPC ........................................................ 375/267
See application file for complete search history.

(56) References Cited

U.S. PATENT DOCUMENTS

| | | | | |
|---|---|---|---|---|
| 5,999,574 A * | 12/1999 | Sun | ..................... | H04L 27/0014 |
| | | | | 375/349 |
| 7,079,596 B1 * | 7/2006 | Namura | ................. | H03D 7/166 |
| | | | | 375/324 |
| 10,284,236 B1 * | 5/2019 | Trotta | ................... | H04B 1/0082 |
| 2011/0176641 A1 * | 7/2011 | Persson | ................... | H04B 1/302 |
| | | | | 375/319 |
| 2013/0130632 A1 * | 5/2013 | Oishi | ..................... | H03B 21/02 |
| | | | | 455/84 |
| 2017/0180175 A1 | 6/2017 | Kong et al. | | |
| 2020/0076453 A1 * | 3/2020 | Sakaki | ................. | H04B 1/0057 |
| 2021/0013916 A1 * | 1/2021 | Shimura | .............. | H01Q 3/2605 |

* cited by examiner

*Primary Examiner* — Tanmay K Shah
(74) *Attorney, Agent, or Firm* — Christensen O'Connor Johnson Kindness PLLC

(57) ABSTRACT

A mixer for mixing a radio frequency signal is described. The mixer includes a local oscillator input, a phase adjustment module, and at least one mixing channel. The local oscillator input is configured to receive a local oscillator signal. The phase adjustment module is configured to control a phase of the local oscillator signal in order to add a desired amount of delay to the local oscillator signal, thereby generating at least one adapted oscillator signal. The at least one adapted oscillator signal has a desired phase difference compared to the local oscillator signal. The at least one mixing channel includes at least one mixer unit having at least one signal input. The at least one mixing channel is configured to receive the at least one adapted oscillator signal. The at least one mixing channel further is configured to forward the adapted oscillator signal to the mixer unit. The at least one signal input is configured to receive an input signal. The at least one signal input further is configured to forward the input signal to the mixer unit. The mixer unit is configured to mix the at least one adapted oscillator signal with the input signal, thereby generating a mixer output signal.

20 Claims, 5 Drawing Sheets

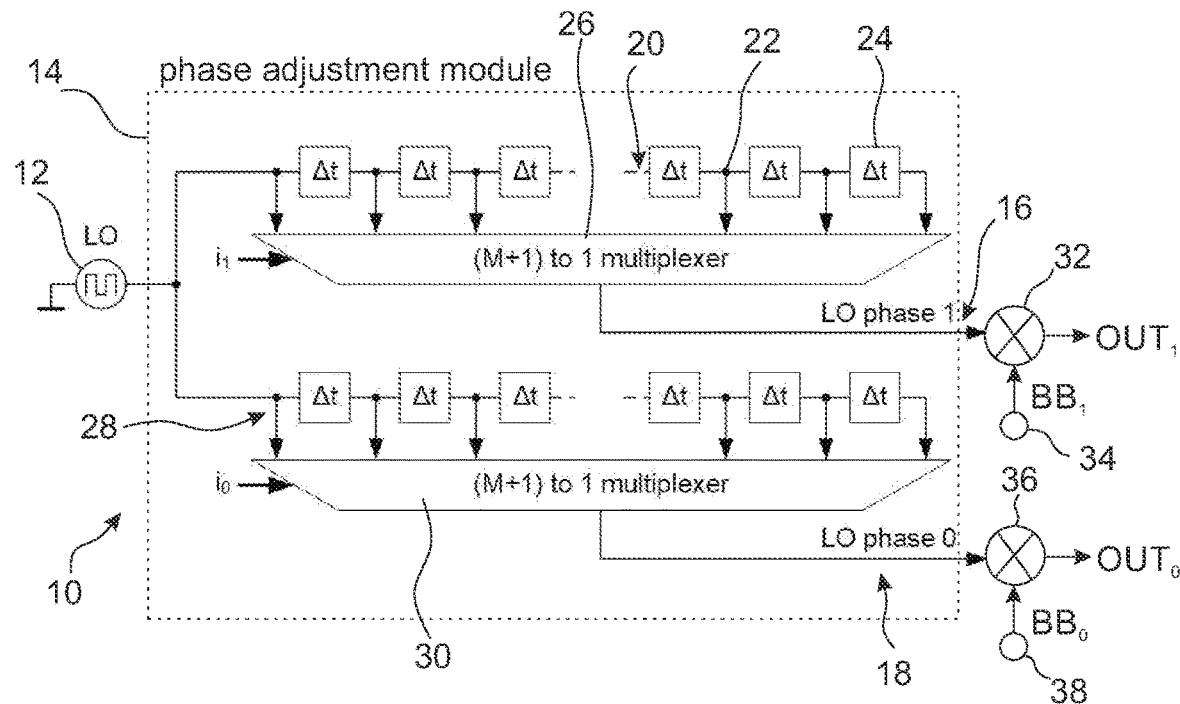
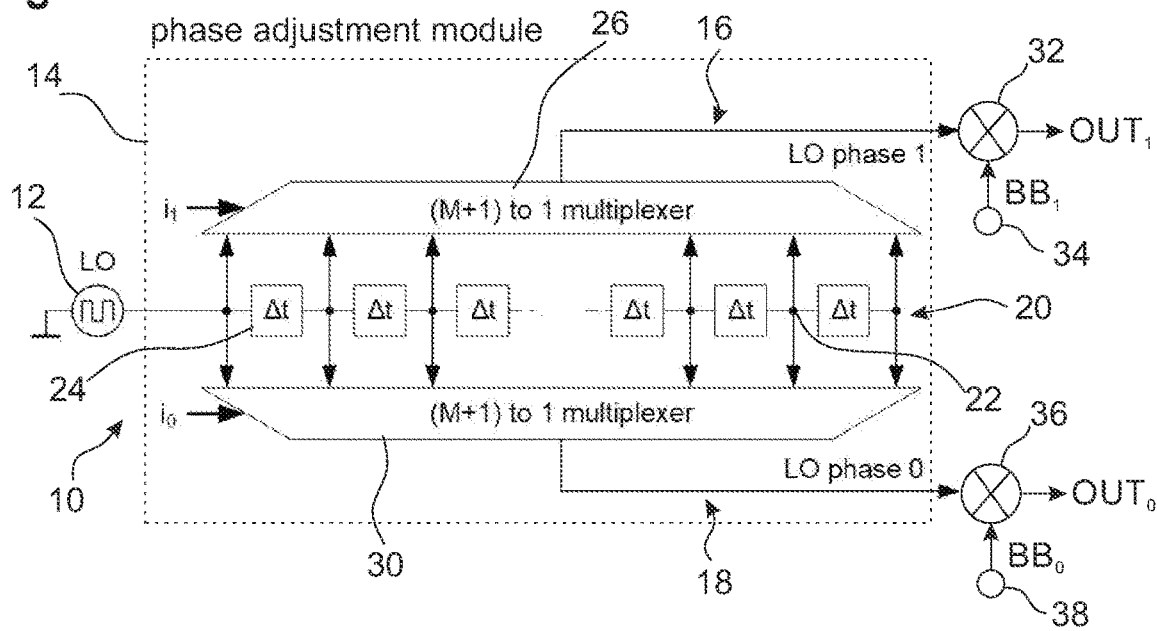

MIXER MODULE FOR MIXING A RADIO FREQUENCY SIGNAL

FIELD OF THE DISCLOSURE

Embodiments of the present disclosure generally relate to a mixer, such as a mixer module, for mixing a radio frequency signal.

BACKGROUND

Certain types of electronic devices, for example vector modulators or harmonic rejection mixers, need several different local oscillator signals having several different phases in their mixing stage.

One way of generating these local oscillator signals having several different phases is using ring oscillators. Depending on the number of gates, ring oscillators are capable of generating several output signals from a single input signal, wherein the individual phases of the output signals differ by integer fractions of 360°.

However, for certain applications it is desirable to use several local oscillator signals having phases that differ from each other by non-integer fractions of 360°, particularly in an arbitrary manner.

Thus, there is a need for a mixer providing several different output signals having adjustable phase relations.

SUMMARY

Embodiments of the present disclosure provide a mixer, such as a mixer circuit or mixer module, for mixing a radio frequency signal. The mixer comprises a local oscillator input, a phase adjustment module comprising one or more circuits, and at least one mixing channel. The local oscillator input is configured to receive a local oscillator signal. The phase adjustment module is configured to control a phase of the local oscillator signal in order to add a desired amount of delay to the local oscillator signal, thereby generating at least one adapted oscillator signal. The at least one adapted oscillator signal has a desired phase difference compared to the local oscillator signal. The at least one mixing channel comprises at least one mixer circuit or unit having at least one signal input. The at least one mixing channel is configured to receive the at least one adapted oscillator signal. The at least one mixing channel further is configured to forward the adapted oscillator signal to the mixer unit. The at least one signal input is configured to receive an input signal. The at least one signal input further is configured to forward the input signal to the mixer unit. The mixer unit is configured to mix the at least one adapted oscillator signal with the input signal, thereby generating a mixer output signal.

The mixer according to the present disclosure is based on the idea to use the phase adjustment module in order to provide at least two different possible phases for the adapted local oscillator signal. The phase adjustment module adds the desired amount of delay to the local oscillator signal, such that the adapted local oscillator signal has the desired phase difference compared to the local oscillator signal. Accordingly, at least two different signals having two different phases are provided, namely the local oscillator signal and the adapted local oscillator signal.

Therein and in the following, the term "control a phase of the local oscillator signal" is understood to mean that the phase adjustment module is configured to adapt the phase of the local oscillator signal in a certain manner. For example, a user of the mixer may choose the amount of delay and/or phase difference (i.e. the desired phase difference) that is to be added to the local oscillator signal, and the phase adjustment module may adapt the phase of the local oscillator signal accordingly.

In other words, the phase adjustment module is configured to adapt the phase of the local oscillator signal in an arbitrary manner. In some embodiments, a user may set the phase of the respective adapted local oscillator signal for one or several mixing channels.

Alternatively, the respective phases of the adapted local oscillator signals may be preset, for example if the mixer is to be used in a specific application requiring specific phases of the individual local oscillator signals.

Thus, a plurality of different adapted local oscillator signals having different phases is provided, wherein the individual phases may differ by non-integer fractions of 360°.

Accordingly, the input signal can be mixed with the adapted local oscillator signal having one of a plurality of different phases, such that the at least one mixer output signal has a desired phase.

In some embodiments, the phase of the local oscillator signal (and thus the phase of the at least one mixer output signal) can be adapted, for example adapted by a user, by choosing the amount of delay that is to be added by the phase adjustment module.

The local oscillator signal may be established as a square-wave signal. As square-wave signals are more resilient to phase noise than sine-wave signals, the resulting mixer output signal may also be more resilient to phase noise. Alternatively, the local oscillator signal may be established as a sine-wave signal.

According to an aspect of the present disclosure, the input signal corresponds to a signal that is to be modulated or that is to be demodulated. In other words, the mixer may be used in a signal transmitter or in a signal receiver, respectively. Accordingly, the at least one input signal may be a baseband signal carrying the information that is to be modulated, or the at least one input signal may be established as an already modulated baseband signal.

According to another aspect of the present disclosure, the mixer comprises several mixing channels, wherein each mixing channel comprises a respective mixer unit having a respective signal input, and wherein the phase adjustment module is configured to generate an individually adapted oscillator signal for every mixing channel. The individually adapted oscillator signals may have phases that are different from each other, such that each input signal is mixed with an adapted local oscillator signal having an individually adapted phase.

The mixer may be configured to output a sum of the mixer output signals of the mixing units. In other words, the individual mixer output signals may be summed, for example by a weighted sum, in order to obtain a final output signal of the mixer.

In an embodiment of the present disclosure, the mixer is configured to output each of the mixer output signals of the mixing units separately. Accordingly, the mixer provides several different output signals, which may have different phases.

According to an aspect of the present disclosure, the phase adjustment module comprises at least one delay line. In general, the at least one delay line adds the desired amount of delay to the local oscillator signal, thereby generating the at least one adapted local oscillator signal. The magnitude of the phase shift between the adapted local oscillator signal and the local oscillator signal depends on the specific delay line used and/or on the point at which the adapted local oscillator signal is picked up within the delay line.

According to another aspect of the present disclosure, the delay line is established as a tapped delay line having at least two taps associated with different predefined phases. The tapped delay line delays the local oscillator signal, such that the adapted local oscillator signal can be picked up with a different amount of delay at the at least two taps.

The tapped delay line may comprise a total number of M delay members, wherein M is an integer bigger than or equal to 2. Accordingly, the tapped delay line comprises M+1 taps, such that the local oscillator signal can be picked up with M+1 different phases at the M+1 taps.

Accordingly, a plurality of different adapted local oscillator signals having different phases is provided, wherein the individual phases may differ by non-integer fractions of 360°.

The magnitude of the phase shift between the individual taps depends on the specific delay member(s) used in the tapped delay line, or more precisely on the phase shift provided by the individual delay member(s).

In some embodiments, the several mixing channels may each be connected to one tap of the tapped delay line, wherein different mixing channels may be connected to different taps.

Alternatively or additionally, the delay line may be established as a heatable delay line, wherein the amount of delay to be added to the local oscillator signal can be set by controlling the temperature of the heatable delay line. For instance, a filament may be used as the heatable delay line.

In a further embodiment of the present disclosure, the phase adjustment module comprises a multiplexer, such as a multiplexer circuit or unit, the multiplexer unit being connected to the taps of the tapped delay line. Accordingly, the multiplexer unit may connect the at least one mixing channel or the several mixing channels with at least one of the taps of the tapped delay line at a time, thereby providing the adapted local oscillator signal(s) having a certain phase to the mixing channel(s).

According to another aspect of the present disclosure, the multiplexer unit is configured to selectively connect at least one of the taps of the tapped delay line with the at least one mixing channel. In some embodiments, the multiplexer unit may be controlled by a control signal in order to selectively connect the at least one tap to the at least one mixing channel. For example, a user may choose which tap(s) are to be connected to which mixing channel(s), and one or several corresponding control signals may be generated for the multiplexer unit based on an associated user input.

In some embodiments, the phase adjustment module comprises a phase interpolation circuit or unit, wherein the multiplexer unit is configured to selectively connect at least two of the taps of the tapped delay line with the phase interpolation unit, and wherein the phase interpolation unit is configured to interpolate between the phases being associated with the at least two taps. In some embodiments, the interpolation unit may be configured to sum the adapted local oscillator signals being associated with the at least two taps, for example by a weighted sum. This way, arbitrary phases can be obtained for the adapted local oscillator signal.

For example, the multiplexer unit may be configured to selectively connect neighboring taps of the tapped delay line with the phase interpolation unit, such that the phase interpolation unit interpolates between two neighboring taps.

Each tap of the tapped delay line may be associated with an inductance and a capacitor. In other words, the signal may be delayed between the individual taps by the respective inductance associated with the tap. Each tap may be coupled to a mixing channel or to the multiplexer unit described above by the respective capacitor. The tapped delay line may be closed off by an Ohm-resistor at both ends of the chain of inductances and capacitors.

It is noted that for high frequency applications, a continuous piece of conductor may serve as a delay line.

In a further embodiment of the present disclosure, the mixer comprises a reference channel being associated with the local oscillator signal. In some embodiments, the reference channel is established as one of the mixing channels of the mixer. Therein, the signal being associated with the reference channel may correspond to the unaltered local oscillator signal.

According to another aspect of the present disclosure, the reference channel comprises a fixed-delay circuit or unit. Accordingly, the local oscillator signal propagating through the reference channel may be delayed by a fixed delay time, wherein the fixed delay time in the reference channel may be bigger than, smaller than, or equal to the delays in other mixing channels.

In a further embodiment of the present disclosure, the phase adjustment module is configured to adapt the phase of the local oscillator signal in an arbitrary manner. In some embodiments, a user may set the phase of the adapted local oscillator signal for one or several mixing channels.

Alternatively, the respective phases of the adapted local oscillator signals may be preset, for example if the mixer is to be used in a specific application requiring specific phases of the individual local oscillator signals.

According to another aspect of the present disclosure, the phase adjustment module comprises a delay-locked loop being associated with the at least one mixing channel. The delay-locked loop can adapt the phase of the local oscillator signal in an arbitrary manner, such that the adapted local oscillator signal has the desired phase shift compared to the local oscillator signal.

The delay and thus the phase shift provided by the delay-locked loop can be set to a specific desired value. Accordingly, a user may choose the delay and thus the phase shift provided to the at least one adapted local oscillator signal.

According to an aspect of the present disclosure, the phase adjustment module comprises several delay-locked loops, each of the delay-locked loops being associated with exactly one of several mixing channels. Accordingly, a plurality of adapted local oscillator signals having different phases is provided to the different mixing channels, wherein the individual phases may differ by non-integer fractions of 360°.

In some embodiments, the respective phase shift of the plurality of adapted local oscillator signals provided by the several delay-locked loops may be adaptable by a user.

According to another aspect of the present disclosure, the phase adjustment module comprises a phase detector, a phase regulator, and an adjustable delay circuit or unit. In general, the phase detector is configured to determine an actual phase of the adapted local oscillator signal with respect to the phase of the local oscillator signal (which may propagate in a reference channel). The determined actual phase may be forwarded to the phase regulator. The phase regulator is configured to adjust a delay provided by the adjustable delay unit based on the actual phase of the adapted local oscillator signal and based on a target phase of the local oscillator signal. In other words, the phase regulator controls the adjustable delay unit based on a comparison of the phases of the local oscillator signal and of the adapted local oscillator signal, such that the desired amount of delay is added to the local oscillator signal, thereby obtaining the adapted local oscillator signal.

In some embodiments, the delay-locked loop may comprise the phase detector, the phase regulator, and/or the adjustable delay unit.

In a further embodiment of the present disclosure, the phase regulator comprises a phase error integrator. Accordingly, the phase adjustment module may comprise a phase controller of first order. More precisely, the phase detector, the phase regulator, and the adjustable delay unit together establish a phase controller of first order.

The phase error integrator may comprise an analog phase error integrator and a digital phase error integrator. The phase regulator may be configured to generate a phase error signal based on a comparison of the momentary phase (i.e. the actual phase) of the adapted local oscillator signal with the momentary phase of the local oscillator signal. The analog phase error integrator may be configured to integrate the phase error signal, thereby obtaining an integral error value. If the integral error value reaches a predetermined positive threshold value or a predetermined negative threshold value, a digital output value of the digital phase error integrator may be incremented by +1 or by −1, respectively, and the integral error value of the analog phase error integrator may be reset to zero. The adjustable delay unit may adjust the phase of the adapted local oscillator signal based on the digital output value of the digital phase error integrator.

In an embodiment of the present disclosure, the adjustable delay unit comprises at least one of a delay line, a heatable delay line, or a tapped delay line. In some embodiments, the adjustable delay unit comprises a tapped delay line and a multiplexer as described above.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

FIG. 2 schematically shows a mixer according to another embodiment of the present disclosure;

FIG. 3 schematically shows a mixer according to another embodiment of the present disclosure;

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
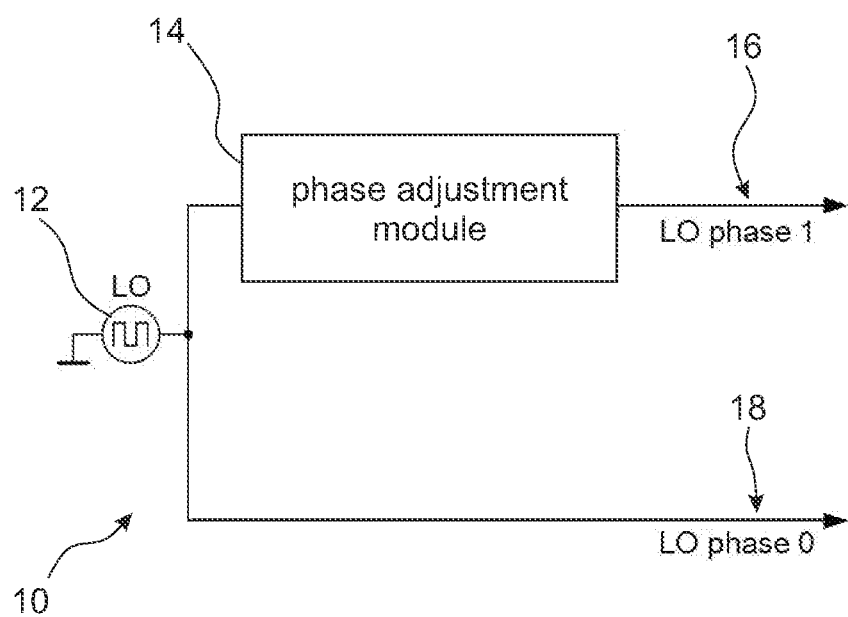
FIG. 1 schematically shows a mixer according to an embodiment of the present disclosure.

FIG. 1 schematically shows a mixer 10 for mixing a radio frequency signal. The mixer 10 comprises a local oscillator input 12, a phase adjustment module 14, a first mixing channel 16, and a second mixing channel 18. Each of the components of the mixer 10 can include one or more circuits for carrying out the intended functionality. The one or more circuits can include, for example, analog and/or digital hardware circuits, software circuits, or a combination of hardware circuits and software circuits.

It is noted that the mixer 10 may comprise any other number of mixing channels, for example three or four mixing channels. Without restriction of generality, an exemplary embodiment of the mixer 10 having two mixing channels 16, 18 is described in the following.

In some embodiments, the term "module," "unit," etc., refers to a combination of hardware (e.g. a processor such as an integrated circuit or other circuitry) and software (e.g. machine- or processor-executable instructions, commands, or code such as firmware, programming, or object code). Furthermore, a combination of hardware and software may include hardware only (i.e. a hardware element with no software elements), software hosted at hardware (e.g. software that is stored at a memory and executed or interpreted at a processor), or hardware with the software hosted thereon. In some embodiments, the hardware may, inter alia, comprise a CPU, a GPU, an FPGA, an ASIC, or other types of electronic circuitry.

In general, the phase adjustment module 14 is configured to adjust a phase of a local oscillator signal LO in order to add a desired amount of delay to the local oscillator signal LO, thereby generating an adapted local oscillator signal.

Several embodiments of the mixer 10, for example several embodiments of the phase adjustment module 14, are described in the following with reference to FIGS. 2 to 9. It is to be understood that individual features described with respect to a certain embodiment are not restricted to the particular embodiment described, but may also be used in combination.

FIG. 2 shows a second embodiment of the mixer 10. The phase adjustment module 14 comprises a first tapped delay line 20 with M+1 taps 22, wherein M is an integer bigger than 1. The individual taps 22 are separated from each other by M delay members 24, wherein the delay members each are configured to add a predetermined delay time $\Delta t$ (and thus a corresponding phase shift $\Delta\varphi=2\pi f_{LO}$, wherein $f_{LO}$ is the frequency of the local oscillator signal) to a signal propagating through the first tapped delay line 20.

The functionality of the delay members 24 will be described in more detail below.

The phase adjustment module 14 further comprises a first multiplexer unit 26 comprised of one or more circuits. The first multiplexer unit 26 is connected to the individual taps 22 of the first tapped delay line 20. The first multiplexer unit 26 is configured to selectively connect one of the individual taps 22 of the first tapped delay line 20 with the first mixing channel 16 based on a first control signal i1.

Accordingly, the first multiplexer unit 26 is established as a (M+1) to 1 multiplexer. For example, the first control signal $i_1$ may be generated based on a user input, such that the user can set which one of the taps 22 is to be connected to the first mixing channel 16.

The phase adjustment module 14 further comprises a second tapped delay line 28 with M+1 taps 22 and M delay members 24. It is noted that the second tapped delay line 28 may comprise a number of delay members 24 other than M, and thus a different number of taps 22 than the first tapped delay line 20. Moreover, the individual delay members 24 of the second tapped delay line 28 may have a delay other than $\Delta t$.

However, without restriction of generality, the case of both tapped delay lines 20, 28 being established equal to each other is described in the following.

The phase adjustment module 14 further comprises a second multiplexer unit 30 comprising one or more circuits. The second multiplexer unit 30 is connected to the individual taps 22 of the second tapped delay line 28. The second multiplexer unit 30 is configured to selectively connect one of the individual taps 22 of the second tapped delay line 28 with the second mixing channel 18 based on a second control signal $i_0$. For example, the second control signal $i_0$ may be generated based on a user input, such that the user can set which one of the taps 22 is to be connected to the second mixing channel 18.

The local oscillator input 12 is configured to receive a local oscillator signal LO. The local oscillator signal LO may be established as a square-wave signal or as a sine-wave signal. The local oscillator input 12 is connected to the first tapped delay line 20 and to the second tapped delay line 28 in a signal transmitting manner, such that a local oscillator signal LO received by the local oscillator input 12 is forwarded to the first tapped delay line 20 and to the second tapped delay line 28.

The first mixing channel 16 comprises a first mixer unit 32 comprised of one or more circuits and a first signal input 34. The second mixing channel 18 comprises a second mixer unit 36 comprised of one or more circuits and a second signal input 38.

The functionality of the mixer 10 is explained in more detail in the following. The local oscillator signal LO is received by the local oscillator input 12 and is forwarded to both tapped delay lines 20, 28. The local oscillator signal LO is delayed by the first tapped delay line 20, thereby obtaining a first adapted local oscillator signal having a predefined phase difference ("LO phase 1" in FIG. 2) compared to the local oscillator signal LO.

More precisely, the local oscillator signal LO is delayed by a certain number of delay members 24 of the first tapped delay line 20, depending on which one of the taps 22 is connected to the first mixing channel 16 by the first multiplexer unit 26. Accordingly, the phase shift of the first adapted local oscillator signal compared to the local oscillator signal is $\Delta\varphi_1=2\pi f_{LO}\cdot\Delta t\cdot N$, wherein N is an integer number bigger than or equal to zero, and smaller than or equal to M. The first adapted local oscillator signal is mixed with a first input signal $BB_1$ being received by the first signal input 34, thereby obtaining a first mixer output signal $OUT_1$.

Similarly, the local oscillator signal is delayed by the second tapped delay line 28, thereby obtaining a second adapted local oscillator signal having a predefined phase difference ("LO phase 0" in FIG. 2) compared to the local oscillator signal LO. More precisely, the local oscillator signal LO is delayed by a certain number of delay members 24 of the second tapped delay line 28, depending on which one of the taps 22 is connected to the second mixing channel 18 by the second multiplexer unit 30. Accordingly, the phase shift of the second adapted local oscillator signal compared to the local oscillator signal is $\Delta\varphi_0=2\pi f_{LO}\cdot\Delta t\cdot K$, wherein K is an integer number bigger than or equal to zero, and smaller than or equal to M.

The second adapted local oscillator signal is forwarded to the second mixing channel 18 by the second multiplexer unit 30. The second adapted local oscillator signal is mixed with a second input signal $BB_0$ being received by the second signal input 38, thereby obtaining a second mixer output signal $OUT_0$.

It is noted that the first input signal $BB_1$ and the second input signal $BB_0$ may each be established as a signal that is to be modulated or that is to be demodulated. In other words, the mixer 10 may be used in a signal transmitter or in a signal receiver, respectively. Accordingly, the input signals $BB_1$, $BB_0$ may each be established as a baseband signal carrying the information that is to be modulated. Alternatively, the input signals $BB_1$, $BB_0$ may each be established as an already modulated baseband signal that is to be demodulated.

The first mixer output signal $OUT_1$ and the second mixer output signal $OUT_0$ may be output by the mixer 10 individually, such that two separate output signals are provided. Alternatively, the first mixer output signal $OUT_1$ and the second mixer output signal $OUT_0$ may be summed, for example by a weighted sum, in order to generate a final output signal of the mixer 10.

FIG. 3 shows a third embodiment of the mixer 10. In the following, only the differences compared to the second embodiment of the mixer 10 described above will be explained, wherein components having a like functionality carry the same reference numerals.

Compared to the second embodiment described above, the mixer 10 according to the third embodiment only has a single tapped delay line 20. The individual taps 22 of the tapped delay line 20 are connected to both of the first multiplexer unit 26 and the second multiplexer unit 30.

Similarly to the second embodiment of the mixer 10, the first multiplexer unit 26 of FIG. 3 is configured to selectively connect one of the taps 22 of the tapped delay line 20 to the first mixing channel 16. The second multiplexer unit 30 of FIG. 3 is configured to selectively connect one of the taps 22 of the tapped delay line 20 to the second mixing channel 18.

Otherwise, the explanations given above with respect to the second embodiment of the mixer 10 also apply to the third embodiment of the mixer 10.

Figure 4:
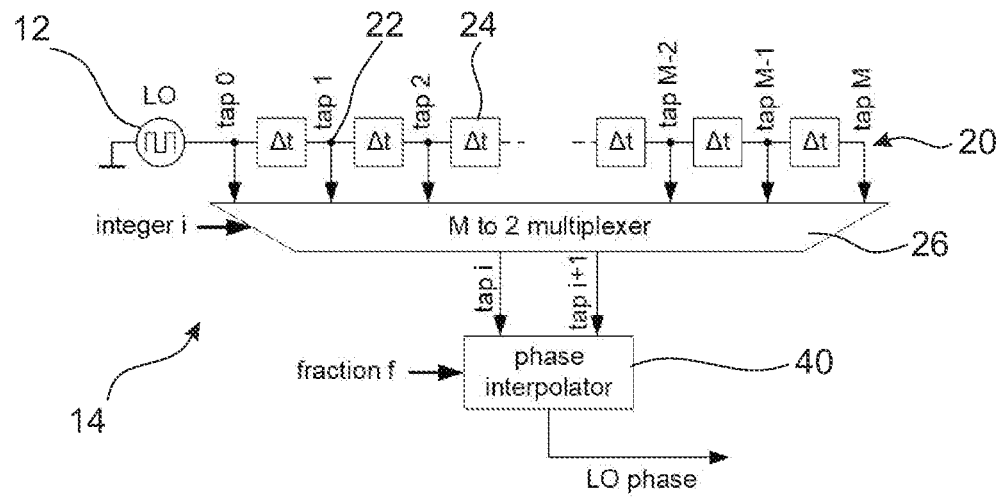
FIG. 4 schematically shows an alternative embodiment of a phase adjustment module of the mixer according to FIG. 2 or 3.

FIG. 4 schematically shows an alternative embodiment of the phase adjustment module 14, which can be used with any of the embodiments of the mixer 10 described above. As shown in FIG. 4, the phase adjustment module 14 comprises a phase interpolation circuit or unit 40 being connected to the first multiplexer unit 26. It is noted that while the phase interpolation unit 40 is only shown to be connected to the first multiplexer unit 26, the same modifications may also be applied to the second multiplexer unit 30.

The first multiplexer unit 26 is configured to selectively connect at least two of the taps 22 of the tapped delay line with the phase interpolation unit 40. The phase interpolation unit 40 is configured to interpolate between the phases being associated with the at least two taps 22.

In some embodiments, the phase interpolation unit 40 may be configured to sum the adapted local oscillator signals being associated with the at least two taps 22, wherein the at least two taps 22 may be neighboring taps. For example, the phase interpolation unit 40 may be configured to sum the adapted local oscillator signals by a weighted sum, as indicated by "fraction f" in FIG. 4.

The fraction f may correspond to the fraction of weights of the adapted local oscillator signals that are to be summed, i.e. the adapted local oscillator signals being associated with the taps I and i+1 in the example shown in FIG. 4.

This way, arbitrary phases can be obtained for the first adapted local oscillator signal (denoted by "LO phase" in FIG. 4).

As mentioned above, the same modifications can be applied to the second multiplexer unit 30, such that arbitrary phases can be obtained for the second adapted local oscillator signal.

Figure 5:
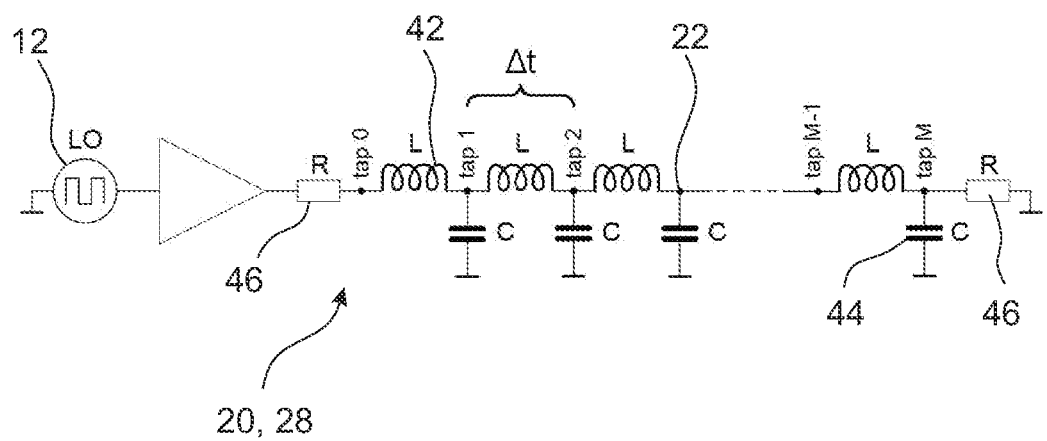
FIG. 5 schematically shows a tapped delay line of a mixer according to any of the FIGS. 1 to 4.

FIG. 5 shows the first tapped delay line 20 and/or the second tapped delay line 28 in more detail. Each tap 22 of the tapped delay line 20, 28 is associated with an inductance 42 and a capacitor 44. The local oscillator signal LO is delayed between the individual taps 22 by the respective inductance 42 being associated with the respective tap 22. Each tap 22 is coupled to the respective multiplexer unit 26, 30 described above by the respective capacitor 44. Accordingly, the delay $\Delta t$ provided by each delay member 24 is equal to $\sqrt{LC}$, wherein L is the inductivity of the inductance 42, and C is the capacitance of the capacitor 44. The tapped delay line 20, 28 may be closed off by an Ohm-resistor 46 at both ends of the chain of inductances 42 and capacitors 44.

It is noted that for high frequency applications, a continuous piece of conductor may serve as a delay-line instead of the tapped delay lines 20, 28 described above. Alternatively or additionally, a heatable delay line may be used, such that the amount of delay provided by the heatable delay line can be controlled by adjusting the temperature of the heatable delay line.

Figure 6:
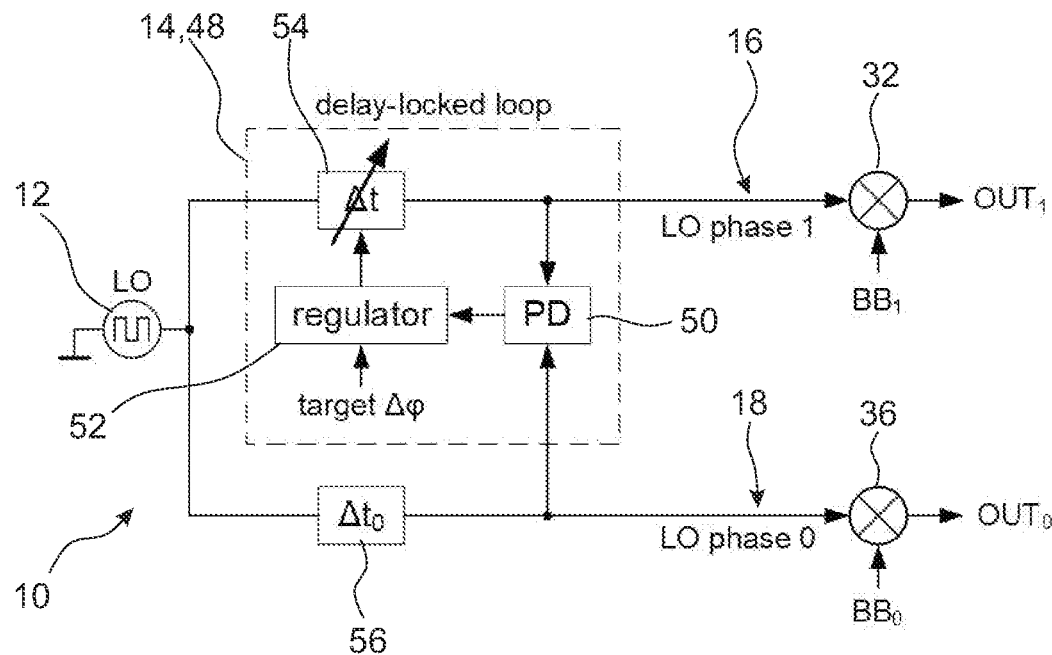
FIG. 6 schematically shows a mixer according to another embodiment of the present disclosure.

FIG. 6 shows a fourth embodiment of the mixer 10. In the following, only the differences compared to the embodiments of the mixer 10 described above will be explained, wherein components having like functionality are denoted with the same reference numerals.

The fourth embodiment of the mixer 10 differs from the embodiments described above in the phase adjustment module 14. As shown in the embodiment of FIG. 6, the phase adjustment module 14 comprises a delay-locked loop 48. The delay-locked loop 48 comprises a phase detector 50, the phase regulator 52, and an adjustable delay circuit or unit 54.

In general, the phase detector 50 is configured to compare the phases of the adapted local oscillator signal that is associated with the first mixing channel 16 with the phase of the local oscillator signal that is associated with the second mixing channel 18, wherein the second mixing channel 18 serves as a reference channel. The result of the comparison, namely the actual phase of the adapted local oscillator signal with reference to the local oscillator signal, is forwarded to the phase regulator 52.

The phase regulator 52 is configured to adjust a delay provided by the adjustable delay unit 54 based on the result of the comparison. In other words, the phase regulator 52 controls the adjustable delay unit 54 based on a comparison of the phases of the local oscillator signal and of the adapted local oscillator signal, such that an intended amount of delay is added to the local oscillator signal by the adjustable delay unit 54, thereby obtaining the adapted local oscillator signal.

It is noted that the adjustable delay unit 54 may, e.g., be established as a delay line, for example as a tapped delay line 20 in combination with a multiplexer unit 26 as described above. In some embodiments, the phase regulator 52 may be configured to control the multiplexer unit 26, such that the multiplexer unit 26 connects the appropriate tap 22 of the tapped delay line 20 with the first mixing channel 16.

The functionality of the delay-locked loop 48 will be described in more detail below.

Optionally, the reference channel, i.e. the second mixing channel 18, may comprise a fixed-delay unit 56. Accordingly, the local oscillator signal propagating through the reference channel, i.e. the second mixing channel 18, may be delayed by a fixed delay time $\Delta t_0$, wherein the fixed delay time $\Delta t_0$ in the reference channel may be bigger than, smaller than, or equal to the delay $\Delta t$ provided by the adjustable delay unit 54 in the first mixing channel 16.

Figure 7:
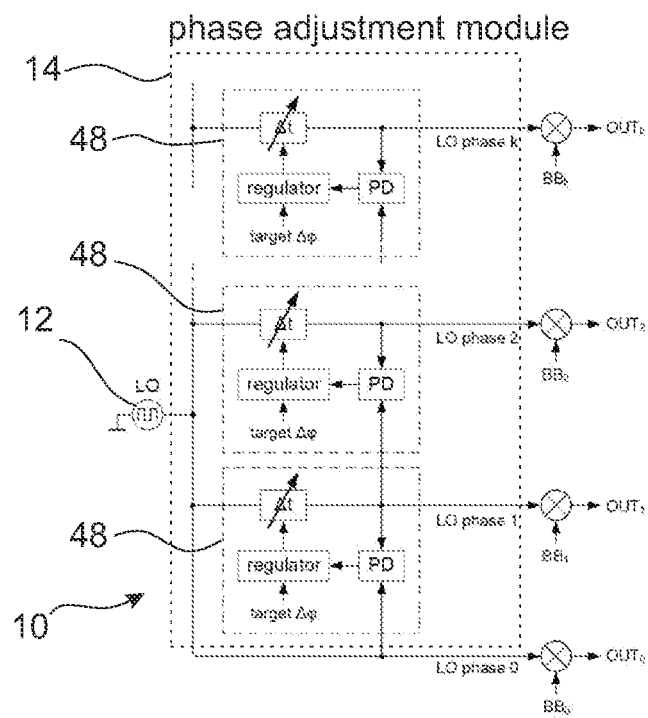
FIG. 7 schematically shows a mixer according to another embodiment of the present disclosure.

FIG. 7 shows a fifth embodiment of the mixer 10. In comparison to the fourth embodiment of the mixer 10 described above, the mixer 10 according to the fifth embodiment comprises a total number of k mixing channels, wherein k is an integer bigger than two.

The mixer 10 comprises a delay-locked loop 48 for each mixing channel other than the reference channel. Accordingly, a number of k different adapted local oscillator signals is provided in addition to the local oscillator signal itself. Thus, k+1 different adapted local oscillator signals with different phases are provided by the phase adjustment module 14 that can be mixed with k+1 different input signals $BB_0$ to $BB_k$.

In some embodiments, a user may choose the magnitude of the phase shift provided by each of the delay-locked loops 48, such that an adapted local oscillator signal having a desired phase shift is provided in each of the mixing channels.

Figure 8:
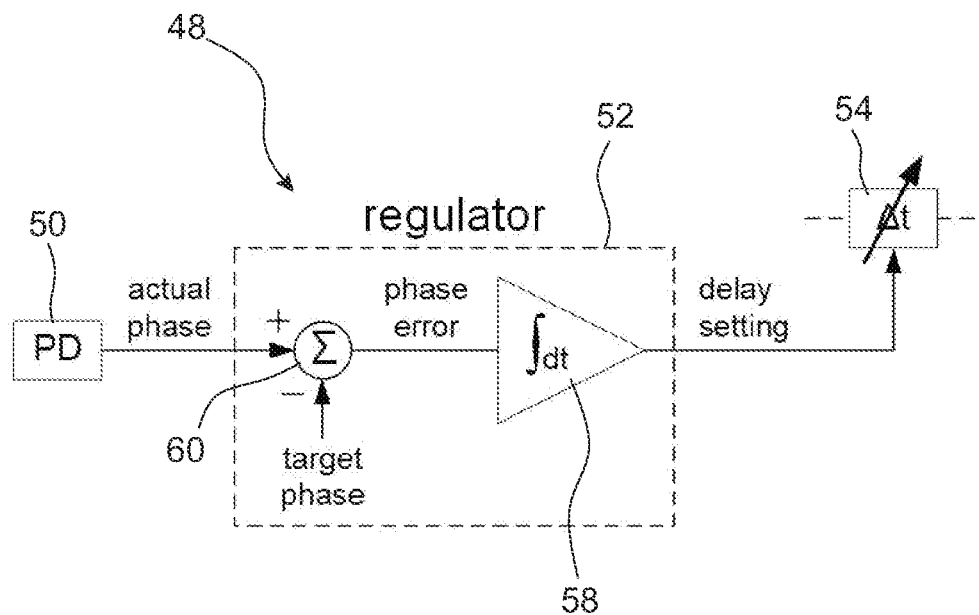
FIG. 8 schematically shows an example of a phase regulator of the mixer according to FIG. 6 or 7.

FIG. 8 shows the delay-locked loop 48 in more detail. In the embodiment of FIG. 8, the phase regulator 52 comprises a phase error integrator 58 and a phase comparator 60. The phase detector 50 determines an actual phase of the respective adapted local oscillator signal with respect to the local oscillator signal in the reference channel.

The phase comparator 60 compares the actual phase of the adapted local oscillator signal with a target phase for the local oscillator signal, and determines a corresponding phase error signal based on the comparison. The phase error integrator 58 integrates the phase error signal, and generates a corresponding delay setting for the adjustable delay unit 54 based on the integrated phase error signal. In other words, the delay-locked loop 48 is established as a phase controller of first order.

Figure 9:
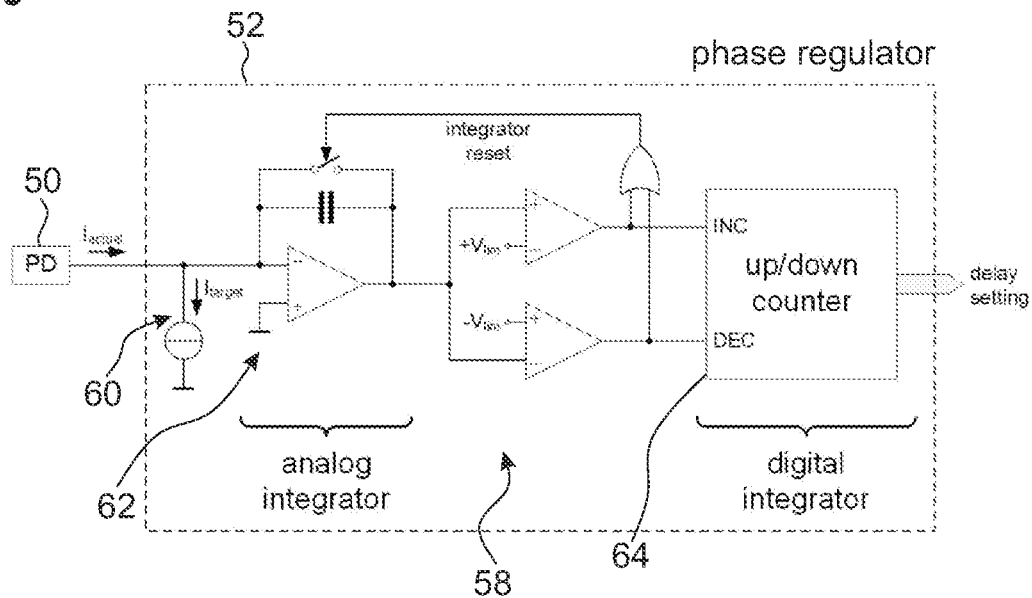
FIG. 9 schematically shows an example of a phase error integrator of the phase regulator of FIG. 8.

FIG. 9 shows an embodiment of the phase regulator 52, wherein the phase error integrator comprises an analog phase error integrator 62 and a digital phase error integrator 64. The phase detector 50 determines an actual phase of the respective adapted local oscillator signal with respect to the local oscillator signal in the reference channel, and generates a corresponding current $I_{actual}$.

The phase comparator 60 compares the actual phase of the adapted local oscillator signal with a target phase for the local oscillator signal. More precisely, the phase comparator 60 compares the current $I_{actual}$ with a current $I_{target}$ representing the target phase of the adapted local oscillator signal, and generates a corresponding phase error signal, namely a difference current $I_{diff} = I_{actual} - I_{target}$. The analog phase error integrator 62 integrates the phase error signal, i.e. the difference current $I_{diff}$, thereby obtaining an integral error value.

If the integral error value reaches a predetermined positive threshold value $+V_{lim}$ or a predetermined negative threshold value $-V_{lim}$, a digital output value (delay setting) of the digital phase error integrator is incremented by +1 or by −1, respectively, and the integral error value is reset to zero.

The adjustable delay unit 54 then adjusts the phase of the adapted local oscillator signal based on the digital output value of the digital phase error integrator.

Summarizing, all of the embodiments of the mixer 10 described above provide a plurality of different adapted local oscillator signals having different phases.

The magnitude of the phase shift provided for each adapted local oscillator signal is adjustable by the phase adjustment module 14. In some embodiments, a user of the mixer 10 can freely adjust the phase shift provided to each of the adapted local oscillator signals.

Certain embodiments disclosed herein, for example the respective module(s), unit(s), etc., utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or other electronic circuitry, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

Of course, in some embodiments, two or more of these components, or parts thereof, can be integrated or share hardware and/or software, circuitry, etc. In some embodiments, these components, or parts thereof, may be grouped in a single location or distributed over a wide area. In circumstances were the components are distributed, the components are accessible to each other via communication links.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about", "approximately", "near" etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A mixer for mixing a radio frequency signal, the mixer comprising a local oscillator input, a phase adjustment circuit, and at least one mixing channel,
    the local oscillator input being configured to receive a local oscillator signal,
    the phase adjustment circuit being configured to control a phase of the local oscillator signal in order to add a desired amount of delay to the local oscillator signal, thereby generating at least one adapted oscillator signal, the at least one adapted oscillator signal having a desired phase difference compared to the local oscillator signal,
    the at least one mixing channel comprising at least one mixer unit having at least one signal input,
    the at least one mixing channel being configured to receive the at least one adapted oscillator signal, the at least one mixing channel further being configured to forward the adapted oscillator signal to the mixer unit,
    the at least one signal input being configured to receive an input signal, the at least one signal input further being configured to forward the input signal to the mixer unit, and
    the mixer unit being configured to mix the at least one adapted oscillator signal with the input signal, thereby generating a mixer output signal.

2. The mixer of claim 1, wherein the input signal corresponds to a signal that is to be modulated or that is to be demodulated.

3. The mixer of claim 1, wherein the mixer comprises several mixing channels, wherein each mixing channel comprises a respective mixer unit having a respective signal input, and wherein the phase adjustment circuit is configured to generate an individually adapted oscillator signal for every mixing channel.

4. The mixer of claim 3, wherein the mixer is configured to output a sum of the mixer output signals of the mixing units.

5. The mixer of claim 3, wherein the mixer is configured to output each of the mixer output signals of the mixing units separately.

6. The mixer of claim 1, wherein the phase adjustment circuit comprises at least one delay line.

7. The mixer of claim 6, wherein the delay line is established as a tapped delay line having at least two taps associated with different predefined phases.

8. The mixer of claim 7, wherein the phase adjustment circuit comprises a multiplexer, the multiplexer being connected to the taps of the tapped delay line.

9. The mixer of claim 8, wherein the multiplexer is configured to selectively connect at least one of the taps of the tapped delay line with the at least one mixing channel.

10. The mixer of claim 9, wherein the phase adjustment circuit comprises a phase interpolation circuit, wherein the multiplexer is configured to selectively connect at least two of the taps of the tapped delay line with the phase interpolation circuit, and wherein the phase interpolation circuit is configured to interpolate between the phases being associated with the at least two taps.

11. The mixer of claim 7, wherein each tap of the tapped delay line is associated with an inductance and a capacitor.

12. The mixer of claim 1, wherein the mixer comprises a reference channel being associated with the local oscillator signal.

13. The mixer of claim 12, wherein the reference channel comprises a fixed-delay circuit.

14. The mixer of claim 1, wherein the phase adjustment circuit is configured to adapt the phase of the local oscillator signal in an arbitrary manner.

15. The mixer of claim 1, wherein the phase adjustment circuit comprises a delay-locked loop being associated with the at least one mixing channel.

16. The mixer of claim 15, wherein the phase adjustment circuit comprises several delay-locked loops, each of the delay-locked loops being associated with exactly one of several mixing channels.

17. The mixer of claim 1, wherein the phase adjustment circuit comprises a phase detector, a phase regulator, and an adjustable delay circuit.

18. The mixer of claim 17, wherein the phase regulator comprises a phase error integrator.

19. The mixer of claim 18, wherein the phase error integrator comprises an analog phase error integrator and a digital phase error integrator.

20. The mixer of claim 17, wherein the adjustable delay circuit comprises at least one of a delay line, a heatable delay line, and a tapped delay line.

* * * * *